United States Patent
Han et al.

(10) Patent No.: US 12,437,986 B2
(45) Date of Patent: Oct. 7, 2025

(54) WAFER CLEANING METHOD AND METHOD FOR MANUFACTURING SEMICONDUCTOR DEVICE

(71) Applicant: CANSEMI TECHNOLOGY INC., Guangdong (CN)

(72) Inventors: Ruijing Han, Guangdong (CN); Hui Zeng, Guangdong (CN)

(73) Assignee: CANSEMI TECHNOLOGY INC., Guangdong (CN)

( * ) Notice: Subject to any disclaimer, the term of this patent is extended or adjusted under 35 U.S.C. 154(b) by 15 days.

(21) Appl. No.: 18/691,373

(22) PCT Filed: Jan. 28, 2022

(86) PCT No.: PCT/CN2022/074721
§ 371 (c)(1),
(2) Date: Mar. 12, 2024

(87) PCT Pub. No.: WO2023/035546
PCT Pub. Date: Mar. 16, 2023

(65) Prior Publication Data
US 2024/0387164 A1    Nov. 21, 2024

(30) Foreign Application Priority Data
Sep. 13, 2021    (CN) .......................... 202111066032.8

(51) Int. Cl.
*H01L 21/02* (2006.01)
(52) U.S. Cl.
CPC .............................. *H01L 21/02057* (2013.01)
(58) Field of Classification Search
None
See application file for complete search history.

(56) References Cited

U.S. PATENT DOCUMENTS 4,236,993 A * 12/1980 Muller .................. C25B 11/043
204/294
5,234,563 A    8/1993 Arai et al.
(Continued)

FOREIGN PATENT DOCUMENTS

CN        1092477 A    9/1994
CN        1249361 A    4/2000
(Continued)

OTHER PUBLICATIONS

WO2014208794 English translation, accessed on May 2025. (Year: 2014).*
(Continued)

*Primary Examiner* — Kaj K Olsen
*Assistant Examiner* — Arlyn I Rivera-Cordero
(74) *Attorney, Agent, or Firm* — MUNCY, GEISSLER, OLDS & LOWE, P.C.

(57) ABSTRACT

The present invention provides a wafer cleaning method and a method for manufacturing semiconductor device. The wafer cleaning method includes: protonating a cleaning solution with a protonator; cleaning a wafer surface with the protonated cleaning solution so that the cleaned wafer surface carries an amount of negative charge smaller than an amount of negative charge present on a wafer surface that has been cleaned with a non-protonated cleaning solution and is covered with a liquid film of the cleaning solution; and purging the wafer surface with a drying gas to remove the liquid film from a center of the wafer surface towards its periphery. The technique proposed in the present invention is able to desirably suppress static electricity on a wafer surface and effectively reduce device failure that may be caused by static electricity, thereby increasing overall yield of integrated circuit manufacture.

16 Claims, 7 Drawing Sheets

```
┌─────────────────────────────────────────────────────────┐
│   PROTONATE CLEANING SOLUTION WITH PROTONATOR           │─ S1
└─────────────────────────────────────────────────────────┘
                            │
                            ▼
┌─────────────────────────────────────────────────────────┐
│ CLEAN WAFER SURFACE WITH PROTONATED CLEANING SOLUTION SO│
│   THAT CLEANED WAFER SURFACE CARRIES AMOUNT OF NEGATIVE │
│ CHARGE SMALLER THAN AMOUNT OF NEGATIVE CHARGE PRESENT ON│─ S2
│   WAFER SURFACE THAT HAS BEEN CLEANED WITH NON-PROTONATED│
│      CLEANING SOLUTION AND IS COVERED WITH LIQUID FILM OF│
│                    CLEANING SOLUTION                    │
└─────────────────────────────────────────────────────────┘
                            │
                            ▼
┌─────────────────────────────────────────────────────────┐
│  PURGE WAFER SURFACE WITH DRYING GAS TO REMOVE LIQUID FILM│─ S3
│     FROM CENTER OF WAFER SURFACE TOWARDS ITS PERIPHERY  │
└─────────────────────────────────────────────────────────┘
```

(56) References Cited

U.S. PATENT DOCUMENTS

| | | | | |
|---|---|---|---|---|
| 5,415,765 A | * | 5/1995 | Banham | B01J 49/08 |
| | | | | 210/279 |
| 5,578,193 A | * | 11/1996 | Aoki | B08B 3/10 |
| | | | | 257/E21.228 |
| 5,725,753 A | | 3/1998 | Harada et al. | |
| 5,733,434 A | * | 3/1998 | Harada | H01L 21/67057 |
| | | | | 257/E21.228 |
| 6,146,468 A | | 11/2000 | Dryer et al. | |
| 2008/0092929 A1 | * | 4/2008 | Yokouchi | H01L 21/67034 |
| | | | | 134/30 |
| 2013/0200501 A1 | * | 8/2013 | Cen | H01L 21/326 |
| | | | | 257/629 |
| 2014/0261537 A1 | | 9/2014 | Chang | |

FOREIGN PATENT DOCUMENTS

| | | | | |
|---|---|---|---|---|
| CN | 103981529 A | | 8/2014 | |
| CN | 106186216 A | | 12/2016 | |
| CN | 107078041 A | | 8/2017 | |
| CN | 107924835 A | | 4/2018 | |
| CN | 105084610 B | * | 11/2018 | C02F 9/06 |
| CN | 110711738 A | | 1/2020 | |
| CN | 112259443 A | | 1/2021 | |
| CN | 112992657 A | | 6/2021 | |
| CN | 113506726 A | | 10/2021 | |
| EP | 1165261 A1 | | 1/2002 | |
| FR | 2816527 A1 | | 5/2002 | |
| JP | 2001156034 A | | 6/2001 | |
| JP | 2010123858 A | | 6/2010 | |
| TW | 296457 B | | 1/1997 | |
| TW | 452833 B | | 9/2001 | |
| WO | WO-2014208794 A1 | * | 12/2014 | C02F 1/4618 |

OTHER PUBLICATIONS

CN105084610 English translation, accessed on May 2025. (Year: 2015).*

CN106186216 English translation, accessed on May 2025. (Year: 2016).*

* cited by examiner

WAFER CLEANING METHOD AND METHOD FOR MANUFACTURING SEMICONDUCTOR DEVICE

CROSS REFERENCE TO RELATED APPLICATIONS

This application is a U.S. National Stage of International Application No. PCT/CN2022/074721 filed on Jan. 28, 2022, for which priority is claimed under 35 U.S.C. § 120; and this application claims priority of Application No. CN 202111066032.8 filed in China on Sep. 13, 2021 under 35 U.S.C. § 119, the entire contents of all of which are hereby incorporated by reference.

TECHNICAL FIELD

The present invention relates to the field of integrated circuit manufacture and, in particular to, a wafer cleaning method and a method for manufacturing semiconductor device.

BACKGROUND

The development of integrated circuits has been following the Moore's law—transistors' critical dimensions have shrunk from several microns in the early days to several nanometers in nowadays. Such shrinkage is increasingly complicating transistor fabrication. Moreover, smaller semiconductor devices are more sensitive to the ingress of impurities, in particular metal and organic impurities, which can significantly affect devices' behavior, performance and reliability in applications. As the number of steps involved in integrated circuit manufacture is increasing and more and more demanding requirements are being imposed on surface cleanness of chips, increasing importance is being attached to cleaning processes used in such manufacture.

During manufacture of chip, impurities may be introduced not only from the surroundings but also from the individual processes used themselves. These may include particulate, metal and organic impurities, all of which may lead to defects of various degrees of severity in the resulting chips, or even scraping in serious cases, causing huge economic losses. Therefore, for such a manufacture process, in addition to minimizing surrounding contamination sources, it is necessary to add a cleaning treatment to each process step. In particular, for advanced processes, cleaning typically accounts for 20% or more of the total process time. To date, wet cleaning remains a prevalent option for this purpose. This technique is used mainly to remove residual photoresist, polymeric residues left from plasma etching, particles, metal ions, organic substances and the like from a wafer surface.

The efficiency of a wet cleaning technique employed in a manufacture process would determine the yield, reliability and efficiency of the process. Therefore, reducing defects in the resulting products through appropriately controlling the wet cleaning technique can make a great contribution to an increase in the product yield. All wet cleaning processes involve drying as their last step for completely eliminating the cleaning solution (usually deionized water (DIW)) used in the previous process step from the wafer surface, preventing any mark from being left on the surface, which may result in secondary contamination. Moreover, a clean and dry surface can prepare the wafer for subsequent processing. The drying step generally involves nitrogen purging and high-speed spinning. Although this practice is advantageous in taking a short time, it is typically associated with the problem of negative charging of the dried wafer surface. Compared with other types of defects (e.g., impurity particles and organic substances), static electricity in a device can degrade its properties and make it unreliable. In worse cases, when the electricity accumulates to a voltage exceeding the device's breakdown voltage, an electric discharge may take place, which may damage the device or cause its failure.

Therefore, there is a need for improvement of wafer cleaning, which can effectively reduce device failure caused by static electricity and thus increase overall yield of integrated circuit manufacture.

SUMMARY OF THE INVENTION

It is an object of the present invention to provide a wafer cleaning method and a method for manufacturing semiconductor device, which can desirably suppress static electricity on a wafer surface and effectively reduce device failure caused by static electricity, resulting in an increase in overall yield of integrated circuit manufacture.

The above object is attained by a wafer cleaning method provided in the present invention, which comprises:

protonating a cleaning solution with a protonator comprising an anodic electrode and a cathodic electrode covered on its surface with an inert film;

cleaning a wafer surface with the protonated cleaning solution so that the cleaned wafer surface carries an amount of negative charge smaller than an amount of negative charge present on a wafer surface that has been cleaned with a non-protonated cleaning solution and is covered with a liquid film of the cleaning solution; and purging the wafer surface with a drying gas to remove the liquid film from a center of the wafer surface towards its periphery.

Optionally, the protonator may comprise a cavity defined by an insulated outer tube with its opposite ends being brought into communication with each other, wherein the anodic electrode and an anion exchange membrane are provided on an inner side wall of the cavity so as to reside one over the other from the outside inwards, and wherein the cathodic electrode is provided in the cavity.

Optionally, protonating the cleaning solution may comprise:

connecting the anodic electrode to a positive pole of a power supply and connecting the cathodic electrode to a negative pole of the power supply, thereby creating an electric field, which drives anions in the cleaning solution to pass through the anion exchange membrane and then be adsorbed to the anodic electrode and drives hydrogen ions in the cleaning solution to move towards the cathodic electrode and then be output in the protonated cleaning solution.

Optionally, the insulated outer tube may be shaped as a round tube, wherein both the anodic electrode and the anion exchange membrane span the entire inner side wall, and wherein the cathodic electrode is tubular and concentrically disposed in the cavity.

Optionally, the insulated outer tube may be shaped as a rectangular parallelepiped, wherein the anodic electrode and the anion exchange membrane are provided on opposite inner side walls of the cavity, and wherein the cathodic electrode is a bias plate oriented in parallel to the anion exchange membrane.

Optionally, the bias plate may have a porous structure.

Optionally, the anodic electrode may be a porous carbon electrode.

Optionally, there may be a silicon dioxide film on the wafer surface, wherein after the cleaning, silanol groups on a surface of the silicon dioxide film are deprotonated, making the wafer surface negatively charged and thereby allowing the wafer surface cleaned with the protonated cleaning solution to carry an amount of negative charge smaller than an amount of negative charge present on a wafer surface that has been cleaned with a non-protonated cleaning solution, and wherein the liquid film over the cleaned wafer surface is positively charged.

Optionally, the wafer cleaning method may further comprise, after the cleaning solution is protonated with the protonator, introducing DIW into the cavity, connecting the anodic electrode to the negative pole of the power supply and connecting the cathodic electrode to the positive pole of the power supply, thereby allowing the anions adsorbed to the anodic electrode to be desorbed and then taken away by the DIW.

Optionally, the cleaning solution may be DIW, to which a water-soluble inorganic salt containing hydrogen ions has been added, and/or carbon dioxide has been introduced.

Optionally, the protonator may comprise a middle chamber and two cathodic chambers arranged in symmetry with respect to the middle chamber, the middle chamber configured to produce hydrogen ions, the cathodic chambers provided on their inner walls opposing the middle chamber with electrodes.

Optionally, the middle chamber may comprise a cationic resin and cation exchange membranes, the cationic resin separated from the cathodic chambers by the cation exchange membranes.

Optionally, in the course of purging the wafer surface with the drying gas, as the liquid film retreats from the center of the wafer surface to the periphery, a concentration of hydrogen ions in the liquid film may gradually increase.

Optionally, protonating the cleaning solution with the protonator may comprise:

connecting the electrodes to a negative pole of a power supply, thereby creating an electric field, which drives hydrogen ions to enter the cathodic chambers, where they are output in the protonated cleaning solution.

Optionally, the wafer cleaning method may further comprise, after the cleaning solution is protonated with the protonator, introducing an acidic aqueous solution to the middle chamber until a pH of an aqueous solution output therefrom reaches 7.

Optionally, the cleaning solution may be DIW.

Optionally, the protonated cleaning solution may have a pH greater than 2.45 and less than 7.

Optionally, in the course of purging the wafer surface with the drying gas, electric potentials of Regions I and II of the liquid film may be calculated according to:

$$\psi(x) = \frac{2RT}{\mathcal{F}} \ln\left[\cos\left(\frac{\mathcal{A}}{2}(x-x_0)\right)\right] \quad (I: 0 \leq x \leq x_0)$$

$$\psi(x) = \frac{2RT}{\mathcal{F}} \ln\left[\frac{e^{\mathcal{A}(x-x_0)}+1}{2e^{\frac{\mathcal{A}}{2}(x-x_0)}}\right] \quad (II: h \geq x \geq x_0)$$

where $$\mathcal{A} = \sqrt{\frac{2C_{i0}}{\epsilon_f \epsilon_0}\frac{\mathcal{F}^2}{RT}},$$

x is a perpendicular distance of a location in the liquid film from the wafer surface, h is a thickness of the liquid film, $x_0$ is a perpendicular distance of a location with a zero electric potential in the liquid film from the wafer surface, R is the universal gas constant, T is an absolute temperature, $\mathcal{F}$ is the Faraday constant, $C_{i0}$ is a molar concentration of hydrogen ions, $\epsilon_f$ is relative permittivity of the protonated cleaning solution, and $\epsilon_0$ is the vacuum permittivity.

Optionally, the drying gas may comprise an inert gas.

The present invention also provides a method for manufacturing semiconductor device, comprising:

cleaning a surface of a wafer according to the wafer cleaning method as defined above; and forming a film layer structure on the cleaned wafer surface.

Compared with the prior art, in the wafer cleaning method and the method for manufacturing semiconductor device provided in the present invention, through cleaning a wafer surface with a protonated cleaning solution, a smaller amount of negative charge is present on the cleaned wafer surface, in comparison with cleaning it with a non-protonated cleaning solution. This can desirably suppress static electricity on the wafer surface and effectively reduce device failure that may be caused by static electricity, thereby increasing overall yield of integrated circuit manufacture.

BRIEF DESCRIPTION OF THE DRAWINGS

In FIGS. 1 to 11, 10 denotes a wafer; 101, a silicon dioxide film; 102, a liquid film; 21, an insulated outer tube; 22, a first electrode; 211, a cavity; 23, an anion exchange membrane; 24, a second electrode; 311, a cationic resin; 312, a cation exchange membrane; 32, a cathodic chamber; 33, an electrode; 34, an inlet; and 35, an outlet.

DETAILED DESCRIPTION

As a silicon wafer surface is easily oxidized, during the manufacture of a semiconductor device from the wafer, there will be a very thin silicon dioxide film on the surface. Upon contact of the wafer surface with a cleaning solution, it will carry an amount of electric charge due to dissociation and association of silicon dioxide. Depending on an electrolyte concentration and pH of the cleaning solution, the amount of electric charge on the wafer surface will vary, and there may be even a point of zero charge (PZC). The electric charge on the wafer surface will not only adsorb charged contaminants, but may also charge a device manufactured from the wafer. In severe cases, the static electricity in the device may cause an electric discharge, which may break down and eventually scrap the device. The occurrence of electric charge on a wafer surface will be explained below.

Figure 1:
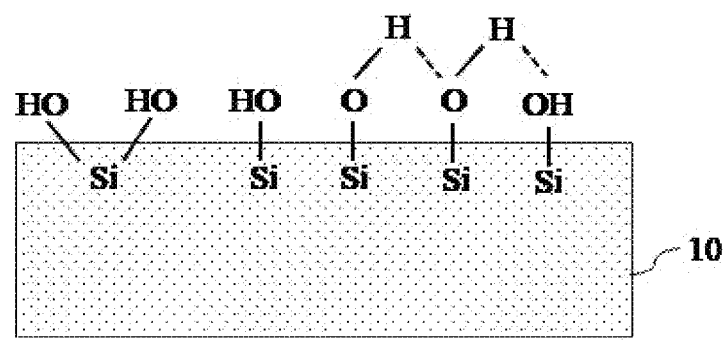
FIG. 1 schematically depicts formation of silanol bonds (at a solid-liquid interface) as a result of contact of a cleaning solution with a silicon dioxide film on a wafer surface.

Reference is first made to FIG. 1. In the process of cleaning a surface of a wafer 10 with a cleaning solution, as a result of contact of a silicon dioxide film (not shown) on the surface of the wafer 10 with the cleaning solution, silanol bonds (Si—OH) will form at the solid-liquid interface. In the cleaning solution, there exists a dynamic equilibrium of the silanol bonds, which can be expressed as the following reaction equations:

$$SiOH \rightleftharpoons SiO^- + H^+ \quad (1)$$

$$SiOH + H^+ \rightleftharpoons SiOH_2^+ \quad (2)$$

Equilibrium constants $K_A$ and $K_B$ for the reaction equations (1) and (2) are:

$$K_A = \frac{\Gamma_{SiO^-} \cdot [H^+]_{s-l}}{\Gamma_{SiOH}} \quad (3)$$

$$K_B = \frac{\Gamma_{SiOH_2^+}}{\Gamma_{SiOH}[H^+]_{s-l}} \quad (4)$$

where $\Gamma_{SiOH}$, $\Gamma_{SiO^-}$ and $\Gamma_{SiOH_2^+}$ are site densities of SiOH, SiO$^-$ and SiOH$_2^+$ on the solid surface, respectively, and $[H^+]_{s-l}$ is a concentration of hydrogen ions (H$^+$) at the solid-liquid interface. Total site density of SiOH molecules is given by:

$$\Gamma_{Total} = \Gamma_{SiOH} + \Gamma_{SiO^-} + \Gamma_{SiOH_2^+} \quad (5)$$

Accordingly, surface charge density $\sigma_s$ of the wafer is given by:

$$\sigma_s = -\mathcal{F}\left(\Gamma_{SiO^-} - \Gamma_{SiOH_2^+}\right) = -\mathcal{F}\Gamma_{Total}\frac{K_A - K_B[H^+]_{s-l}^2}{K_A + [H^+]_{s-l} + K_B[H^+]_{s-l}^2} \quad (6)$$

If the cleaning solution is a common electrolyte solution containing N types of ions, then an electric potential of the cleaning solution satisfies the Poisson-Boltzmann equation:

$$\nabla^2 \psi = -\frac{F}{\epsilon_0 \epsilon_f} \sum_{i=1}^{4} z_i C_{i0} \exp\left(-\frac{z_i F \psi}{RT}\right) \quad (7)$$

where $\psi$ is the electric potential of the cleaning solution, $\nabla^2$ is the Laplace operator, $\mathcal{F}$ is the Faraday constant, $C_{i0}$ is the molar concentration of the cleaning solution, $z_i$ is the valence of the i-th electrolyte, R is the gas constant, T is the temperature of the cleaning solution, $\epsilon_0$ is the vacuum permittivity, and $\epsilon_f$ is the relative permittivity of the cleaning solution. Moreover, the concentration of hydrogen ions at the solid-liquid interface and a concentration of hydrogen ions in the liquid phase satisfy the Boltzmann distribution:

$$[H^+]_{s-l} = [H^+]_0 \exp\left(\frac{\mathcal{F}\zeta}{RT}\right) \quad (8)$$

where $[H^+]_0$, denotes the concentration of hydrogen ions in the liquid phase, which satisfies the relationship pH=−log($[H^+]_0$) with the pH value of the cleaning solution, where $\zeta$ represents the zeta potential.

The electric potential $\psi$ satisfies the following boundary conditions: as a distance x from the wafer surface tends towards infinity (i.e., x→∞), $\psi=0$; and surface charge density of the silicon dioxide film satisfies $-\epsilon_0\epsilon_f n \cdot \nabla\psi = \sigma_s$, where n denotes a normal vector, and $\nabla$ represents a gradient operator.

When a background electrolyte in the cleaning solution is present at a concentration much greater than those of H$^+$ and OH$^-$ ions therein, the contribution of H$^+$ and OH$^-$ to the charge density $\sigma_s$ in Eqn. (7) is ignorable. When this is the case, and if the background electrolyte in the cleaning solution is a binary symmetric electrolyte consisting of only cations and anions, the electric potential $\psi$ can be expressed as:

$$\psi = \frac{2RT}{\mathcal{F}z} \ln\left[\frac{1 + \exp(-\kappa x)\tanh\left(\frac{\mathcal{F}z\zeta}{4RT}\right)}{1 - \exp(-\kappa x)\tanh\left(\frac{\mathcal{F}z\zeta}{4RT}\right)}\right] \quad (9)$$

where $z$ is the valence of the electrolyte, $K^{-1}$ is the Debye length and K is the reciprocal of the Debye length. $K^{-1}$ is given by $$\kappa^{-1} = \left(\frac{\epsilon_0 \epsilon_f RT}{2z^2 \mathcal{F}^2 C_0}\right)^{\frac{1}{2}} \quad (10)$$

Combining Eqns. (6), (8) and (9), it is found that the wafer surface charge density satisfies:

$$\frac{2\epsilon_0 \epsilon_f \kappa RT}{z\mathcal{F}} \sinh\left(\frac{\mathcal{F}z\zeta}{2RT}\right) = -\mathcal{F}\Gamma_{total}\frac{K_A - K_B[H^+]_{s-l}^2}{K_A + [H^+]_{s-l} + K_B[H^+]_{s-l}^2} \quad (11)$$

Cleaning a wafer surface with a cleaning solution is a frequent practice in semiconductor device manufacture. For example, before a gate dielectric layer (silicon dioxide) is formed on a wafer surface, a Standard Clean 1 (SC1, containing NH$_4$OH, H$_2$O$_2$ and H$_2$O) or Standard Clean 2 (SC2, containing HCl, H$_2$O$_2$ and H$_2$O) solution is often used to remove particulate, metal and other impurities from the surface of the wafer. A more advanced process typically uses a SC1 or SC2 solution with a lower NH$_4$OH or HCl concentration. In a process at a 0.18-micron or lower node, a SC1 solution with a NH$_4$OH:H$_2$O$_2$:H$_2$O volume ratio in the range of 1:1:50 to 1:1:100 (and hence a pH ranging from 10 to 7, making it basic) or a SC2 solution with a HCl: H$_2$O$_2$:H$_2$O volume ratio in the same range (and hence a pH ranging from 7 to 1, making it acidic) is usually used.

In order to solve Eqn. (11) above, if the concentration, pH and other parameters of the cleaning solution have been correctly determined, then the only unknown, $\zeta$, can be determined using the MATLAB function $f_{zero}$. When substituting $\zeta$ into Eqn. (9), we can obtain a spatial distribution of the electric potential. In addition, based on $\zeta$, the wafer surface charge density $\sigma_s$ can be evaluated with Eqns. (6) and (8). Below, the wafer surface charge density in the cleaning solution is calculated with the parameters presented in Table 1, in which sites denotes sites.

TABLE 1

| Parameter | Value | Unit |
|---|---|---|
| $\epsilon_0 \epsilon_f$ | 7.08 × 10$^{-10}$ | $\frac{F}{m}$ |
| R | 8.31 | $\frac{J}{mol} \cdot K$ |
| $\mathcal{F}$ | 96490 | $\frac{C}{mol}$ |
| T | 298 | K |
| $\Gamma_{Total}$ | 8 | $\frac{sites}{nm^2}$ |
| pK$_A$ = −logK$_A$ | 7.6 | |
| pK$_B$ = −logK$_B$ | 1.9 | |

Figure 2:
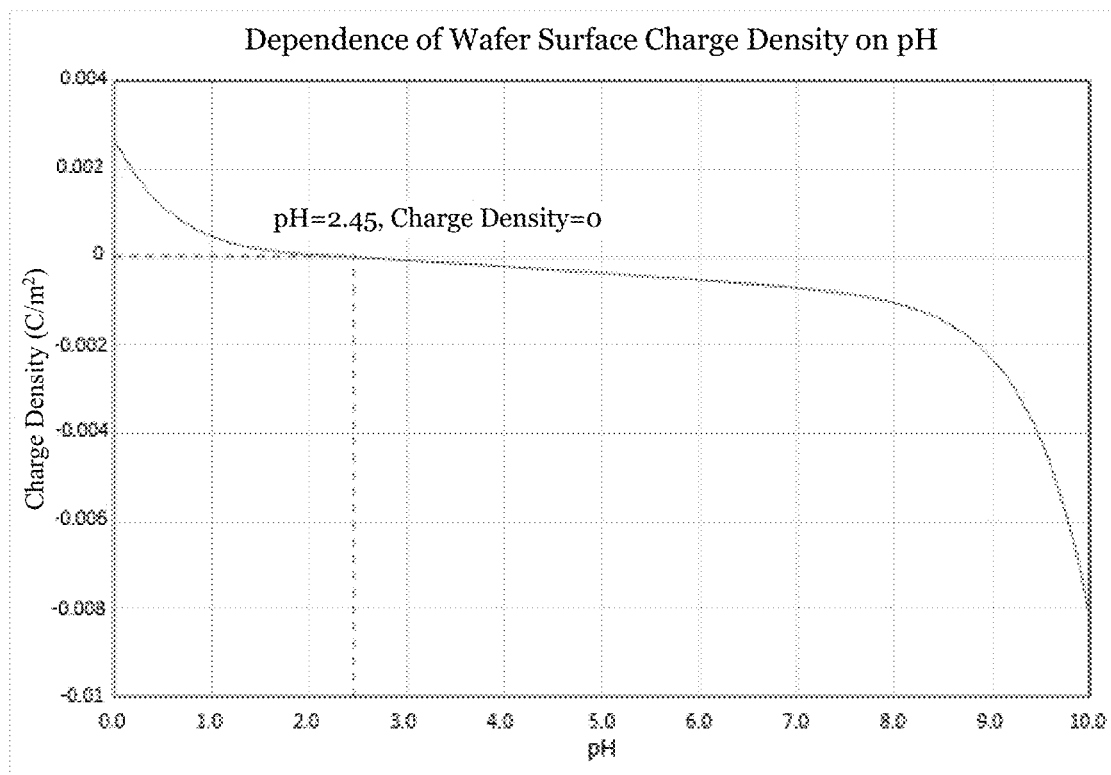
FIG. 2 shows simulated dependence of wafer surface charge density on a pH of a cleaning solution.

FIG. 2 shows simulated variation of the wafer surface charge density with pH of the cleaning solution (SC1 or SC2, with a concentration in a practical range). As can be seen from FIG. 2, when the pH of the cleaning solution is greater than 2.45 and less than or equal to 10, silanol groups (SiOH) on the surface of the silicon dioxide film will be deprotonated into SiO$^-$. Consequently, the surface of the silicon dioxide film is negatively charged after it comes into contact with the cleaning solution, and the surface charge density depends on the pH of the cleaning solution. In FIG. 2, there is a PZC on the wafer surface, which corresponds to a pH value of 2.45. At a lower pH, the wafer surface will be positively charged due to an excess of hydrogen ions, leading to a positive potential.

After the wafer is cleaned with the cleaning solution, a film of the cleaning solution may remain on the wafer surface. The wafer may be then spun on a turntable to dry the wafer surface. In this drying process, while the wafer is fast spinning on the turntable, a high-purity inert gas (e.g., argon or nitrogen) may be purged from a pipe above the wafer toward the center of the wafer surface or a nearby location. According to the present invention, the drying process may be divided into the three stages as follows: (1) fast thinning of the liquid film under an impact of the inert gas; (2) disintegration of the liquid film under the action of repulsion of disjoining pressure when its thickness is reduced to 50 nm and consequent formation of an initial desiccated region and a liquid film rim surrounding the desiccated region; and (3) rapid expansion and outward spreading of the desiccated region under the action of a flow field created by the high-speed spinning until the entire wafer surface is desiccated at the end of the drying process.

Since the wafer surface is deprotonated and negatively charged in the cleaning solution, the liquid film is charged with the same amount of positive charge. As the drying process proceeds, a portion of the liquid film rim interfacing with the desiccated region is rippled (corrugated). Moreover, positive charge carried by the ripples accumulates with the expansion of the desiccated region. Here, it is assumed that the wafer surface charge density $\sigma_s$ is proportional to charge density $\sigma_{Rim}$ of the ripples, i.e., $$\sigma_S = -\alpha \sigma_{Rim} \quad (12)$$

where $\alpha$ is a scaling factor.

Moreover, an electric charge $Q_{Rim}$ of the liquid film rim and its capacitance $C_{Rim}$ and electric potential $\psi_{Rim}$ satisfy:

$$Q_{Rim} = C_{Rim} \psi_{Rim} \quad (13)$$

Eqn. (12) can be linearized into:

$$\alpha(\psi_{Rim}) = \alpha_0 + \alpha_1 \frac{q \psi_{Rim}}{k_B T} = \alpha_0 + \alpha_1 \frac{q Q_{Rim}}{C_{Rim} k_B T} \quad (14)$$

where, q=−e denotes a unit amount of electric charge and q=−e; k$_B$ is the Boltzmann's constant; T is the temperature of the liquid film; and $\alpha_0$ and $\alpha_1$ are linearization coefficients.

Substituting Eqn. (14) into Eqn. (12), we obtain:

$$\sigma_S = -\alpha(\psi_{Rim})\sigma_{Rim} = -\left(\alpha_0 + \alpha_1 \frac{q Q_{Rim}}{C_{Rim} k_B T}\right)\sigma_{Rim} \quad (15)$$

The capacitance of a conductive object is generally related to its geometric factors such as dimensions and shape, as well as to the medium where it is in. The geometry of the liquid film rim cannot be expressed by an analytic expression. In order to avoid complicated numerical calculations, here, according to the assumption that the liquid film rim is a circular ring, its capacitance is calculated as:

$$C_{Rim} = 4\pi\epsilon_0 r \quad (16)$$

When the liquid film retreats from the center of the wafer surface to a radius r (of the desiccated region), electric charge $Q_s$ will be left on the wafer surface, and at the same time, an equal amount of electric charge $Q_{Rim}$ of the opposite polarity will transfer into the liquid film rim, as expressed by the following differential equation:

$$dQ_s(r) = \sigma_S(2\pi r dr) = -dQ_{Rim}(r) \tag{17}$$

When Eqns. (12) and (14) are substituted into Eqn. (17), we have:

$$dQ_{Rim}(r) = \alpha \sigma_{Rim}(2\pi r dr) = \left(\alpha_0 + \alpha_1 \frac{qQ_{Rim}}{C_{Rim}k_B T}\right)\sigma_{Rim}(2\pi r dr) \tag{18}$$

The left and right sides of Eqn. (18) can be rearranged into:

$$\frac{dQ_{Rim}}{dr} - \frac{1}{\lambda} 2 Q_{Rim} = 2\pi \alpha_0 \sigma_{Rim} r \tag{19}$$

where $$\lambda = \frac{2\epsilon_0 k_B T}{\alpha_1 q \sigma_{Rim}} \tag{20}$$

Under the assumed boundary condition, $Q_{Rim}(r=0)=0$, the amount of electric charge carried by the liquid film rim at the radius r can be derived by integrating Eqn. (18), as:

$$Q_{Rim} = -2\pi \alpha_0 \lambda \sigma_{Rim}\left[r + \lambda\left(1 - e^{\frac{r}{\lambda}}\right)\right] \tag{21}$$

From Eqn. (12), (18) and (20), variation of the wafer surface charge density with the radius r can be modeled as:

$$\sigma_S = -\frac{1}{2\pi r}\frac{dQ_{Rim}}{dr} = \alpha_0 \lambda \sigma_{Rim}\left[\frac{1}{r}\left(1 - e^{\frac{r}{\lambda}}\right)\right] \tag{22}$$

Figure 3:
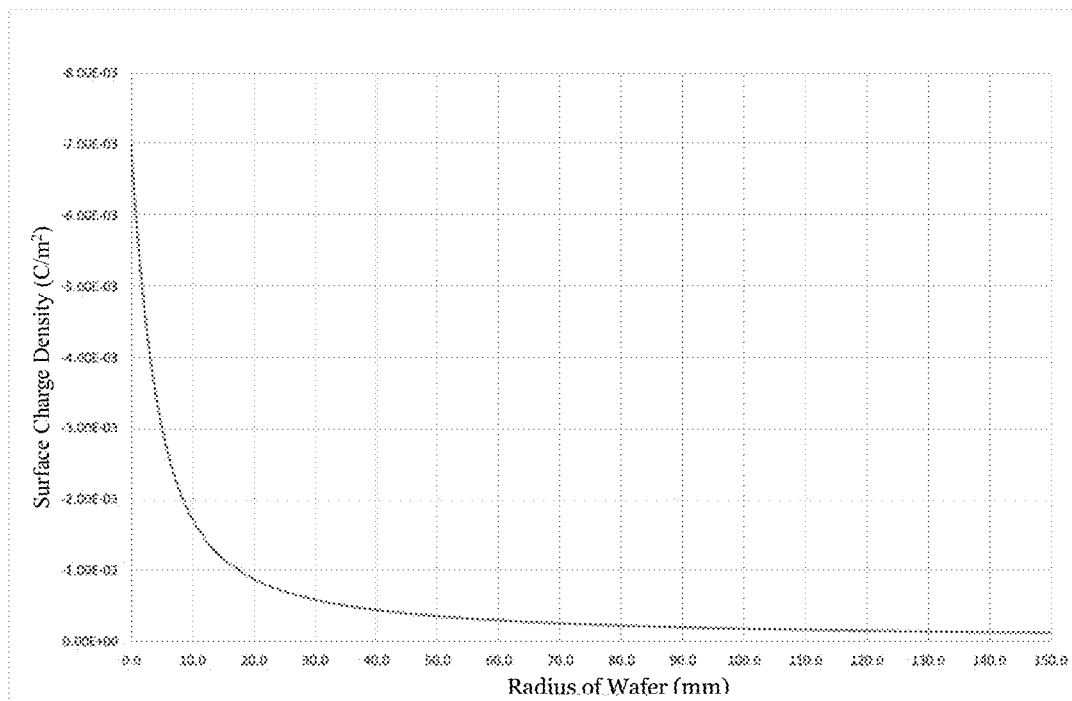
FIG. 3 shows a simulated wafer surface charge density profile after a drying process is performed.
Figure 4:
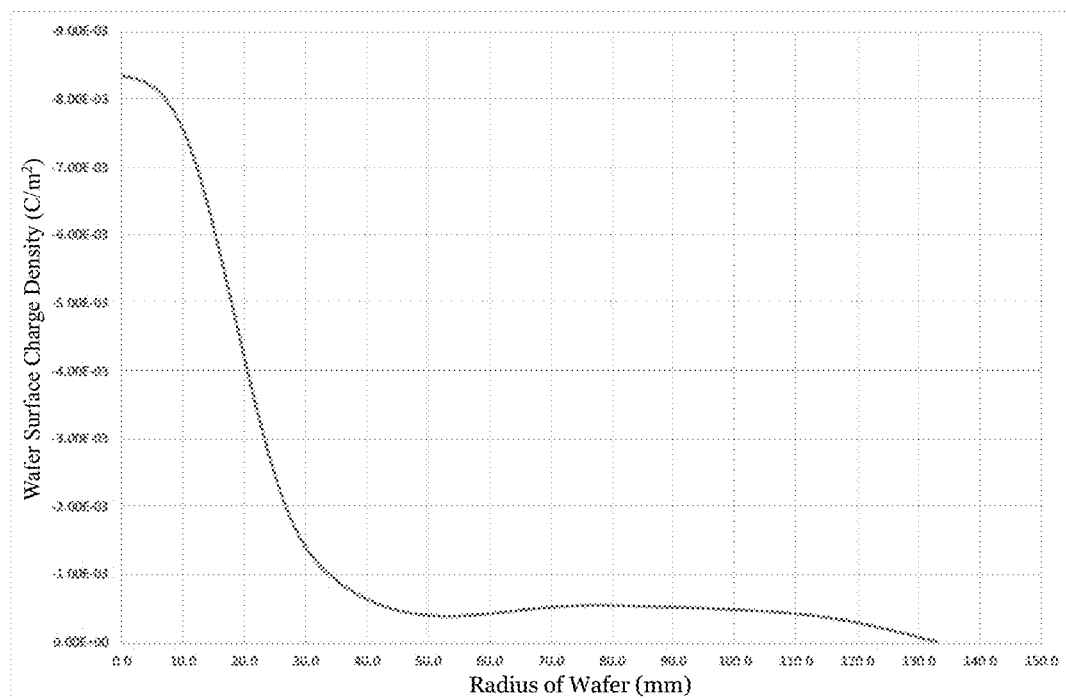
FIG. 4 shows a measured wafer surface charge density profile after a drying process is performed.

A wafer surface charge density profile during the drying process was calculated, as shown in FIG. 3, according to Eqns. (20) and (22) (the parameters therein are listed in Table 2). As can be seen from FIG. 3, the wafer surface charge density is highest at the center. During the drying process, as the circular desiccated region gradually spreads outwards, the electric charge in the liquid film rim accumulates, leading to an increasing electric potential, that deprotonation must overcome to occur. As a result, the wafer surface charge density gradually decreases as the radius increases. The simulated profile shown in FIG. 3 is exactly in line with a measured profile as shown FIG. 4 in terms of both profile and values. It is found that the center of the wafer surface is negatively charged and the charge density is highest at the center and radially decreases outwards. It is to be noted that the drying process measurement shown in FIG. 4 was conducted at a turntable spinning speed of 1000 rpm, while the drying process simulation of FIG. 3 was performed without taking into account the influence of fluid mechanics at the spinning speed on the wafer surface charge density.

TABLE 2

| Parameter | Value | Unit |
| --- | --- | --- |
| $\sigma_{Rim}$ | $0.28 \times 10^{-3}$ | $\frac{C}{m^2}$ |
| $\alpha_0$ | 25 | |
| $\alpha_1$ | $0.65 \times 10^{-6}$ | |
| $\epsilon_0$ | $8.85 \times 10^{-12}$ | $\frac{F}{m}$ |
| $k_B$ | 8.31 | $\frac{J}{K}$ |
| e | $1.6 \times 10^{-19}$ | C |
| T | 298 | K |

In conclusion, from the above discussed wafer surface charging mechanisms during the cleaning and drying processes, the following findings can be obtained. In the cleaning process, if the pH of the cleaning solution is greater than 2.45 and less than or equal to 10, the wafer surface will be negatively charged and exhibit a negative electric potential, and a lower pH will lead to lower charge density. If the pH of the cleaning solution is 2.45, the wafer surface will have a zero electric potential. If the pH of the cleaning solution is lower than 2.45, the wafer surface will be positively charged and exhibit a positive potential. In the drying process, if the pH of the cleaning solution is greater than 2.45 and less than or equal to 10, then the negative charge density is highest at the center of the wafer surface and decreases radially towards the periphery. Moreover, the positive charge in the liquid film rim accumulates as it gradually retreats towards the periphery. Therefore, charging of the wafer surface can be suppressed by increasing the acidity of the cleaning solution (i.e., lowering its pH).

Conventionally, the cleaning solution is usually deionized water (DIW), and its acidity can be increased by adding an acidic agent or gaseous carbon dioxide to it. The former approach is problematic because anions contained in the acidic agent tend to remain on the wafer surface and possibly cause secondary contamination. In contrast, the latter approach is free of this problem as carbon dioxide is highly volatile and will not cause secondary contamination, and is therefore prevalently used.

Solubility of carbon dioxide in DIW depends on its partial pressure and the temperature of DIW. Carbon dioxide is a weak acid and develops the following equilibrium reactions with DIW:

$$CO_2(g) + H_2O \rightleftharpoons CO_2(aq) + H_2O \tag{23}$$

$$CO_2(aq) + H_2O \rightleftharpoons H_2CO_3 \tag{24}$$

$$K_H = \frac{[H_2CO_3]}{P_{CO_2}} \tag{25}$$

where $K_H$ is a temperature-dependent Henry's law constant, and $P_{CO_2}$ is the partial pressure of carbon dioxide. Carbonic acid is further decomposed in DIW:

$$H_2CO_3 \rightleftharpoons H^+ + HCO_3^- \tag{26}$$

$$HCO_3^- \rightleftharpoons H^+ + CO_3^{2-} \tag{27}$$

Equilibrium constants for reaction Eqns. (26) and (27) are:

$$K_1 = \frac{[H^+][HCO_3^-]}{[H_2CO_3]} \quad (28)$$

$$K_2 = \frac{[H^+][CO_3^{2-}]}{[HCO_3^-]} \quad (29)$$

An equilibrium reaction constant for DIW is:

$$K_w = [H^+][OH^-] \quad (30)$$

As a carbonic acid solution is overall neutral, we get:

$$[H^+] = [OH^-] + [HCO_3^-] + 2[CO_3^{2-}] \quad (31)$$

Substituting Eqns. (25) and (28) to (30) into Eqn. (31), we obtain:

$$[H^+]^3 - (K_w + K_H K_1 P_{CO_2})[H^+] - 2K_H K_1 K_2 P_{CO_2} = 0 \quad (32)$$

According to Eqn. (32), at a given temperature, the concentration of hydrogen ions (pH) is solely dependent on the partial pressure of the carbon dioxide. Temperature dependencies of $K_H$, $K_1$, $K_2$ and $K_W$ are given by the following equations:

$$pK_H = -\frac{2622.38}{T} - 0.017841T + 15.5873 \quad (33)$$

$$pK_1 = -126.34048 + \frac{6320.813}{T} + 19.568224\ln(T) \quad (34)$$

$$pK_2 = -90.18333 + \frac{5143.692}{T} + 14.613358\ln(T) \quad (35)$$

$$\ln(K_w) = 148.9802 - \frac{13847.26}{T} - 23.6521\ln(T) \quad (36)$$

Figure 5:
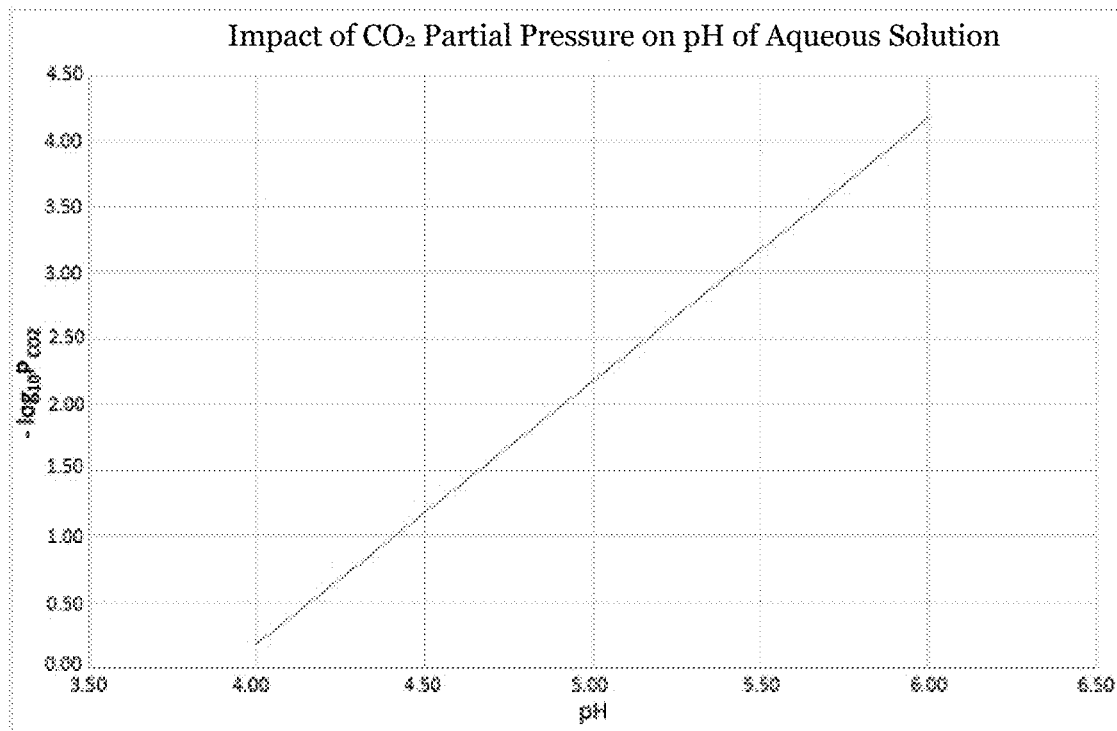
FIG. 5 shows dependence of a pH of DIW on a partial pressure of carbon dioxide.

Dependence of a pH of a carbonic acid solution on a partial pressure of carbon dioxide (atm) at 25° C. can be plotted according to Eqn. (32), as shown in FIG. 5. As can be seen from the figure, a lower pH of the carbonic acid solution requires a higher partial pressure of carbon dioxide. Due to the high volatility of carbon dioxide, in order to obtain a carbonic acid solution with a pH of 4, carbon dioxide must be provided at a partial pressure as high as 0.664 atm. Likewise, in order to obtain a carbonic acid solution with a pH of 3.9, carbon dioxide must be provided at a partial pressure as high as 1.052 atm, higher than one standard atmospheric pressure. It is difficult to introduce carbon dioxide into DIW while achieving such a high partial pressure. In practice, achieving a carbonic acid solution with a very low pH by introducing carbon dioxide into DIW would complicate both the system and process, let alone the fact that it is intrinsically impractical to achieve a pH of 2.45 or lower with this method. This explains poor suppression of wafer surface electric charging.

In view of this, in the present invention, there is proposed a wafer cleaning method, which can desirably suppress electric charging of a wafer surface at low process complexity while avoiding secondary contamination from being caused to the wafer surface.

Objects, advantages and features of the present invention will become more apparent upon reading the following more detailed description of the present invention with reference to the accompanying drawings. Note that the figures are provided in a very simplified form not necessarily drawn to exact scale and for the only purpose of facilitating easy and clear description of the embodiments.

Figure 6:
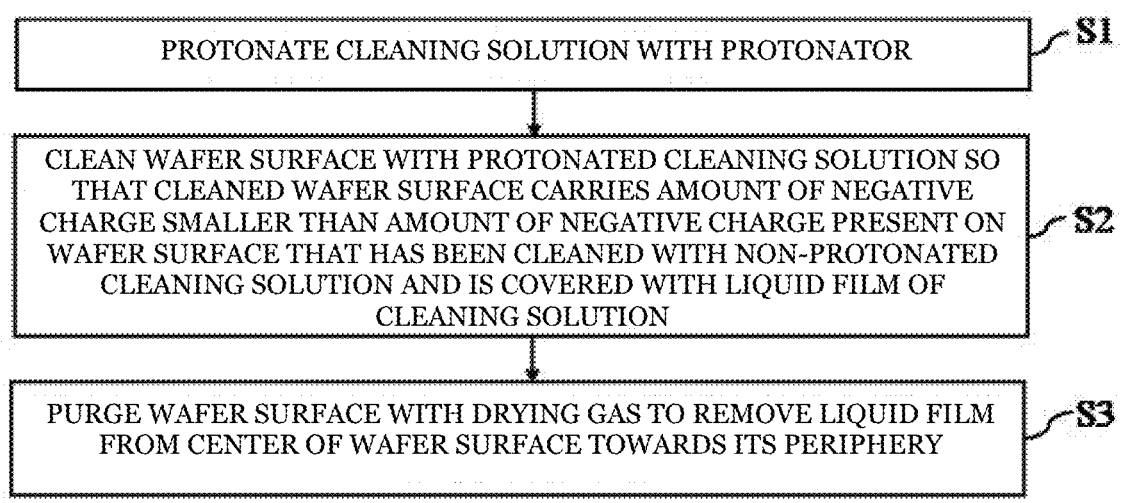
FIG. 6 is a flowchart of a wafer cleaning method according to an embodiment of the present invention.

In an embodiment of the present invention, there is provided a wafer cleaning method. FIG. 6 shows a flow diagram of a wafer cleaning method according to an embodiment of the present invention. As shown, the wafer cleaning method includes the steps of:

(S1) protonating a cleaning solution with a protonator;

(S2) cleaning a wafer surface with the protonated cleaning solution so that the cleaned wafer surface is covered with a liquid film of the cleaning solution and is charged with an amount of negative charge smaller than an amount of negative charge present on a wafer surface that has been cleaned with a non-protonated cleaning solution; and (S3) purging the wafer surface with a drying gas to remove the liquid film from a center of the wafer surface towards its periphery.

A more detailed description of the wafer cleaning method of this embodiment is set forth below.

In step S1, the cleaning solution is protonated with the protonator.

The protonation may be accomplished before the cleaning solution is used to clean the wafer surface.

Figure 7:
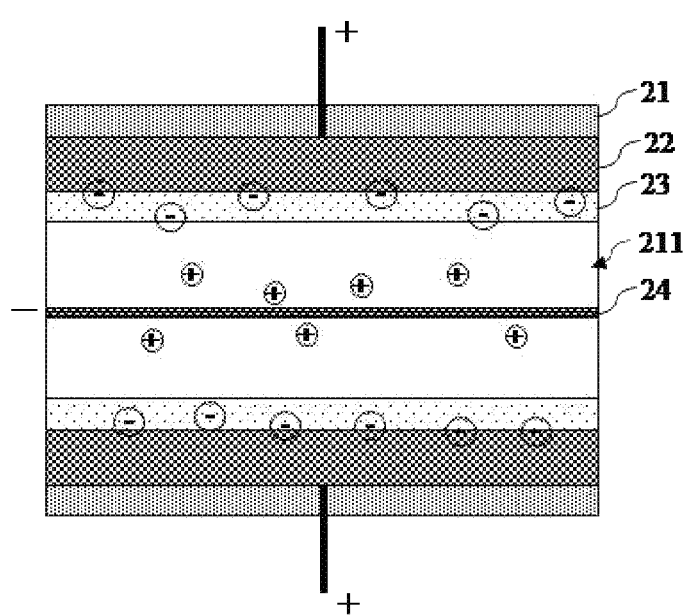
FIG. 7 is a schematic diagram showing the structure of a protonator according to an embodiment of the present invention.
Figure 8:
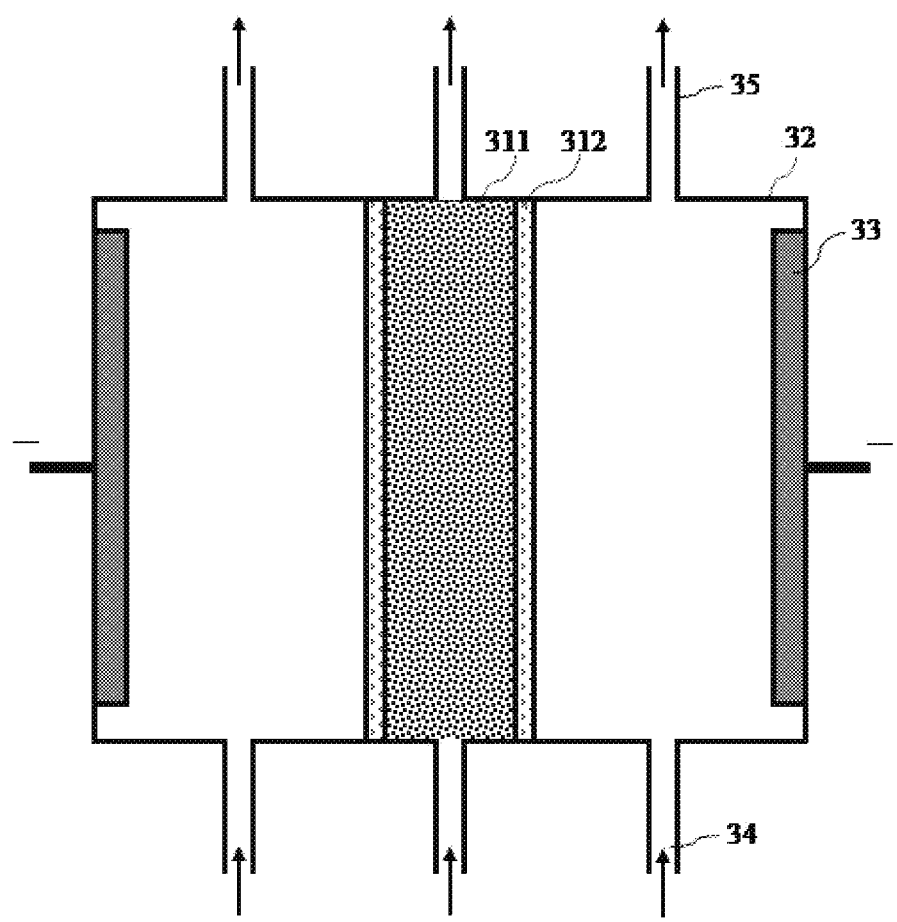
FIG. 8 is a schematic diagram showing the structure of a protonator according to another embodiment of the present invention.

The protonator may be structured as shown FIG. 7 or 8.

Referring to FIG. 7, the protonator may include an insulated outer tube 21 with its opposite ends being brought into communication with each other. The insulated outer tube 21 may define a cavity 211 having an inner side wall provided thereon with a first electrode 22 and an anion exchange membrane 23, which are stacked one over the other from the outside inwards. A second electrode 24 may be provided in the cavity 211.

The first electrode 22 may be formed of porous carbon with a pore size of 1 μm to 50 μm. The second electrode 24 may be surface-coated with an inert film (not shown) for providing the second electrode with protection. The inert film may be polytetrafluoroethylene, for example.

The anion exchange membrane 23 may be a solid polymer electrolyte membrane containing cationic groups (quaternary ammonium groups, such as poly-$N^+Me_3$) and mobile negatively charged anions (e.g., $OH^-$). The anion exchange membrane 23 provides medium allowing selective migration of anions from the cleaning solution in a central region of the cavity 211 towards a peripheral region. Additionally, it can prevent hydrogen ions from moving into an anodic region connected to a positive pole of a power supply, creating a pH difference between different regions.

The anion exchange membrane 23 provides the advantages as follows in applications: 1) low internal electric resistance, which results in minimized loss; 2) high selectivity, which enables it to exhibit very high permeability to monovalent ions and very high unpermeability to ions of the same electric polarity, non-ionic molecules and solvents; 3) excellent mechanical and dimensional stability; 4) good chemical stability over a wide pH range and in the presence of an oxidant; and 5) operability over a wide range of current densities and under varying temperature, current density, pH and other conditions.

The insulated outer tube 21 may be shaped as a round tube. In this case, both the first electrode 22 and the anion exchange membrane 23 may span the entire inner side wall of the cavity 211. The second electrode 24 may be tubular and concentrically disposed in the cavity 211.

Alternatively, the insulated outer tube 21 may be shaped as a rectangular parallelepiped. In this case, the first electrode 22 and the anion exchange membrane 23 may be both provided on two opposite inner side walls of the cavity 211, but not on the remaining two opposite inner side walls thereof. Moreover, the second electrode 24 may be a bias plate, which may be provided at the center of the cavity 211 and in parallel to the anion exchange membrane 23. The bias plate may be a porous plate-like structure allowing passage of the cleaning solution in the cavity 211 through pores therein.

Protonating the cleaning solution with the protonator may include creating an electric field by connecting the first electrode 22 to a positive (+) pole of a power supply and connecting the second electrode 24 to a negative (−) pole of the power supply. Under the action of the electric field, anions in the cleaning solution travel through the anion exchange membrane 23 and are then adsorbed on the first electrode 22. At the same time, hydrogen ions in the cleaning solution are driven by the electric field towards the second electrode 24 and output in the protonated cleaning solution. No redox reaction occurs on the first electrode 22 and the second electrode 24.

The non-protonated cleaning solution is DIW, to which a water-soluble inorganic salt containing hydrogen ions has been added, and/or carbon dioxide has been introduced. As a result of the protonating step, anions in the cleaning solution are adsorbed onto the first electrode 22, and protonated DIW (i.e., proton-rich DIW) is output as the protonated cleaning solution.

In one example, the cleaning solution may be DIW, to which carbon dioxide has been introduced. During passage of the cleaning solution through the protonator, $H^+$ and $HCO_3^-$ ions in DIW are separated by a sufficiently strong electric field provided by the protonator. $HCO_3^-$ ions migrate towards an anodic region connected to the positive pole of the power supply (i.e., towards the first electrode 22), pass through the anion exchange membrane 23 and reach the first electrode 22, and are adsorbed onto the wall of a network of tortuous pores in the first electrode 22 under the action of static electricity. At the same time, $H^+$ ions migrate towards a cathodic region connected to the negative pole of the power supply (i.e., towards the second electrode 24) and are output in the protonated DIW, making the DIW rich in hydrogen ions (protons).

Under the action of an electric field, a charged ion moves in an orthogonal fluid field along a curved path. Therefore, in order to collect $HCO_3^-$ ions as much as possible, the time required for them to move a maximum distance in the direction of the electric field must be shorter than the time required for them to pass through the protonator in the fluid field at a minimum velocity.

Table 3 lists the mobility of common ions. As seen, the mobility of $H^+$ is 5 times that of $HCO_3^-$. In order to achieve ion collection within one second, strength of the electric field is required to be 1 kV/cm. The breakdown voltage of drinking water is generally higher than 100 kV/cm. As the conductivity of the protonated DIW is less than drinking water, such strength of the electric field in the protonator will not cause electrical breakdown.

TABLE 3

| Type of Ions | Mobility ($10^{-8}$ m$^2$s$^{-1}$V$^{-1}$) |
| --- | --- |
| $H^+$ | 36.26 |
| $OH^-$ | 20.64 |
| $HCO_3^-$ | 7.46 |
| $CO_3^{2-}$ | 4.61 |

In addition, after long-term use of the porous carbon electrode (i.e., the first electrode 22), the wall area of the mircopores therein available for $HCO_3^-$ adsorption may have experienced a reduction, adversely affecting the efficiency of subsequent $HCO_3^-$ adsorption. Therefore, the protonator may be regenerated (by desorption, as a reverse process of adsorption) after it has been used a certain period of time. The regeneration may include: introducing DIW with a resistivity of 18.3 MΩ·cm into the cavity 211; and connecting the first electrode 22 to the negative pole of the power supply and connecting the second electrode 24 to the positive pole of the power supply, allowing the anions adsorbed on the first electrode 22 to be desorbed and taken away by the DIW. During operation, the $HCO_3^-$ ions adsorbed on the wall of the internal pores in the porous carbon electrode under the action of static electricity are desorbed under the action of repulsion, and after leaving the porous carbon electrode, they pass through the anion exchange membrane 23 and move towards the second electrode 24. Finally, they are flushed away by the DIW.

Alternatively, referring to FIG. 8, the protonator may include a middle chamber for generating hydrogen ions and two cathodic chambers 32 arranged in symmetry with respect to the middle chamber. The middle chamber may include a cationic resin 311 and cation exchange membranes 312. The cationic resin 311 may be separated from the cathodic chambers 32 by the cation exchange membranes 312. Inner walls of the two cathodic chambers 32 opposing the middle chamber may be each provided with an electrode 33.

Pair of inlets 34 and outlets 35 may be provided on side walls of the middle chamber and the two cathodic chambers 32. Each of the pairs of inlets 34 and outlets 35 may be provided on opposing side walls of one of the chambers that no electrode 33 is provided on.

Each electrode 33 is covered on its surface with an inert film (not shown) for providing protection to the electrode 33.

The non-protonated cleaning solution may be DIW.

In this case, protonating the cleaning solution with the protonator may include: introducing DIW through the inlets 34 into the middle chamber and the two cathodic chambers 32; and connecting the two electrodes 33 to a negative pole of a power supply, creating electric fields. Under the action of the cationic resin 311, hydrogen ions are produced in the DIW through the middle chamber. After that, under the action of the electric fields, the hydrogen ions pass through the cation exchange membranes 312 and enter the two cathodic chambers 32, where they are taken away by the DIW therethrough. As a result, protonated DIW rich in hydrogen ions is output from the outlets 35 of both cathodic chambers 32, while ordinary DIW is output from the outlet 35 of the middle chamber.

After the protonator is used for a period of time, the cationic resin 311 may lose its ability to produce hydrogen ions. In this case, regeneration of the protonator may be carried out, which may include: introducing an acidic aqueous solution containing hydrogen ions into the middle chamber. Upon an aqueous solution output from the middle chamber reaching a pH of 7, the regeneration of the cationic resin 311 is completed.

In the embodiments shown in FIGS. 7 and 8, the protonated cleaning solution (DIW) has a pH greater than 2.45 and less than 7.

In step S2, a wafer surface is cleaned with the protonated cleaning solution so that the cleaned wafer surface is covered with a liquid film of the cleaning solution and is charged with an amount of negative charge smaller than an amount of negative charge present on a wafer surface that has been cleaned with a non-protonated cleaning solution.

The wafer may include a substrate and device structures formed in the substrate. The substrate may be any suitable substrate known to those skilled in the art, such as silicon (Si), silicon germanium (SiGe), silicon carbide (SiC), silicon germanium carbide (SiGeC) and silicon-on-insulator (SOI). The device structures may be sources/drains, gates, etc., for example. It is to be noted that the present invention is not limited to any particular structure of the wafer, and any suitable wafer may be chosen according to the intended devices.

As can be seen from the above discussion of wafer surface charging mechanisms, the wafer surface is covered with a silicon dioxide film, and after being cleaned with a cleaning solution with a pH greater than 2.45 and less than or equal to 10, it will be negatively charged. According to this embodiment, cleaning a wafer surface with the protonated cleaning solution enables the cleaned wafer surface to be charged with a smaller amount of negative charge, thus suppressing wafer surface charging.

In step S3, a drying gas is used to purge the wafer surface to remove the liquid film from a center of the wafer surface towards its periphery.

The drying gas may be output from a pipe aligned with the center of the wafer surface or a nearby location so that the purging can start from the center of the wafer surface. Moreover, during purging, the wafer may be spun on a turntable, causing the liquid film to withdraw from the center of the wafer surface towards its periphery.

The drying gas may include an inert gas. As can be seen from the above discussion of wafer surface charging mechanisms, during the removal of the liquid film from the center of the wafer surface towards its periphery by purging the wafer surface with the drying gas, negative charge density on the wafer surface is highest at the center and gradually decreased radially toward the periphery. Moreover, as the liquid film increasingly retreats towards the periphery, positive charge builds up in the liquid film.

Since the wafer surface has been cleaned with the protonated cleaning solution and thus charged with a smaller amount of negative charge in step S2, a smaller initial amount of negative charge is present on the wafer surface at the beginning of the drying process. Moreover, since the liquid film is made up of the protonated cleaning solution, as it retreats from the center of the wafer surface towards the periphery thereof, the concentration of hydrogen ions in the liquid film gradually increases, additionally suppressing charging of the wafer surface.

During the cleaning of the wafer with the protonated cleaning solution, for the semiconductor-liquid system in the protonated (H$^+$) cleaning solution, electric charge in the protonated cleaning solution and an electric potential distribution thereof satisfies the Poisson-Boltzmann equation:

$$\frac{d^2\psi}{dx^2} = -\frac{1}{\epsilon_f \epsilon_0} \mathcal{F} z_i C_{i0} e^{-\frac{z_i \mathcal{F} \psi}{RT}} \quad (37)$$

The parameters in Eqn. (37) are summarized in Table 4.

TABLE 4

| Parameter | Description |
|---|---|
| x | a perpendicular distance from a location in the cleaning solution to the wafer surface (cm) |
| $\psi$ | a potential at x (v) |
| $\epsilon_f$ | relative permittivity of the cleaning solution |
| $\epsilon_0$ | the vacuum permittivity = 8.85 × 10$^{-12}$ (F/m) |
| F | the Faraday constant (C/mol) |
| $z_i$ | the valence of H$^+$ = 1 |
| $C_{i0}$ | a molar concentration of H$^+$ ions (mol/cm$^3$) |
| R | the universal gas constant = 8.31 J · K$^{-1}$ · mol$^{-1}$ |
| T | the temperature of the cleaning solution (K) |

Thus, after the wafer is cleaned with the protonated cleaning solution, the drying process on the wafer involves both a solid-liquid interface and a liquid-gas interface. The solid-liquid interface is electronegative, while the liquid-gas interface is electropositive because of the protonated cleaning solution. Due to the continuity of the electric potential, within the thickness h of the liquid film, there is a point of zero potential with zero electric field strength:

$$\psi|_{x=x_0} = 0 \quad (38a)$$

$$\left.\frac{d\psi}{dx}\right|_{x=x_0} = 0 \quad (38b)$$

$$\left.\frac{d\psi}{dx}\right|_{x=0} = -\frac{1}{\epsilon_f \epsilon_0} \sigma_s \quad (39)$$

where $x_0$ is a depth of the liquid film at the point of zero potential, and $\sigma_s$ is the wafer surface charge density of Eqn. (6).

Eqn. (37) can be transformed as follows:

Assuming a dimensionless electric potential:

$$\varphi = \frac{\mathcal{F}\psi}{RT} \quad (40)$$

then $$\frac{d\varphi}{dx} = \frac{\mathcal{F}}{RT}\frac{d\psi}{dx} \quad (41)$$

Eqn. (37) can be transformed into:

$$\frac{d^2\varphi}{dx^2} = -\frac{1}{\epsilon_f \epsilon_0} \mathcal{F} C_{i0} \frac{\mathcal{F}}{RT} e^{-\varphi} \quad (42)$$

Multiplying both sides of Eqn. (42) by $$\frac{d\varphi}{dx},$$

we get:

$$\frac{d\varphi}{dx} \cdot \frac{d^2\varphi}{dx^2} = -\frac{1}{\epsilon_f \epsilon_0} \mathcal{F} C_{i0} \frac{\mathcal{F}}{RT} e^{-\varphi} \frac{d\varphi}{dx} \quad (43)$$

Eqn. (43) can be merged and simplified into:

$$\frac{1}{2} \frac{d}{dx}\left(\frac{d\varphi}{dx}\right)^2 = -\frac{1}{\epsilon_f \epsilon_0} \mathcal{F} C_{i0} \frac{\mathcal{F}}{RT} \frac{d(-e^{-\varphi})}{dx} \quad (44)$$

By indefinitely integrating Eqn. (44), we obtain the general solution as follows:

$$\left(\frac{d\varphi}{dx}\right)^2 = \frac{2}{\epsilon_f \epsilon_0} \mathcal{F} C_{i0} \frac{\mathcal{F}}{RT} (e^{-\varphi}) + C \quad (45)$$

Let $$\mathcal{A} = \sqrt{\frac{2 C_{i0}}{\epsilon_f \epsilon_0} \frac{\mathcal{F}^2}{RT}} \quad (46)$$

where $\mathcal{F}$ denotes the reciprocal of the Debye length (i.e., K). When this is simplified by substituting the boundary conditions $x=x_0$, $\varphi=0$, $$\frac{d\varphi}{dx} = 0$$

and $C=\mathcal{F}$ therein, we have:

$$\frac{d\varphi}{dx} = \mathcal{A}\sqrt{|e^{-\varphi} - 1|} \quad (47)$$

Now, we divide the liquid film into two regions: Region I: $0 \sim x_0$; and Region II: $x_0 \sim h$ and integrate them separately. As a result, the electric potential $\varphi$ of Region I is negative, and $e^{-\varphi} \geq 1$. The electric potential $\varphi$ of Region II is positive, and $e^{-\varphi} \leq 1$.

Separating the independent variable x and the dependent variable $\varphi$ in Eqn. (47) on the opposite sides of the equation, we obtain:

(Region I)

$$\int dx = \frac{1}{\mathcal{A}} \int \frac{d\varphi}{\sqrt{e^{-\varphi} - 1}} \quad (区域 1) \quad (48a)$$

(Region II)

$$\int dx = \frac{1}{\mathcal{A}} \int \frac{d\varphi}{\sqrt{1 - e^{-\varphi}}} \quad (区域 2) \quad (48b)$$

Eqn. (48a) describes dependence of the electric potential $\varphi$ on the distance x from the wafer surface in Region I. Eqn. (48b) describes dependence of the electric potential $\varphi$ on the distance x from the wafer surface in Region II.

After Eqn. (48a) is integrated and the boundary condition is substituted therein, we get:

$$x = \frac{2}{\mathcal{A}} \arcsin\left(e^{\frac{\varphi}{2}}\right) + \left(x_0 - \frac{\pi}{\mathcal{A}}\right) \quad (49)$$

$$\varphi(x) = 2\ln\left[\cos\left(\frac{\mathcal{A}}{2}(x - x_0)\right)\right] \quad (50)$$

Eqn. (48b) is integrated as:

$$x = \frac{2}{\mathcal{A}} \ln\left(\sqrt{e^{\varphi} - 1} + e^{\frac{\varphi}{2}}\right) + \mathcal{D} \quad (51)$$

When the boundary condition of Eqn. (38a) is substituted therein, $\mathcal{D} = x_0$ can be obtained. Accordingly, Eqn. (51) can be modified into:

$$\frac{\mathcal{A}}{2}(x - x_0) = \ln\left(\sqrt{e^{\varphi} - 1} + e^{\frac{\varphi}{2}}\right) \quad (52)$$

$$e^{\frac{\mathcal{A}}{2}(x-x_0)} - e^{\frac{\varphi}{2}} = \sqrt{e^{\varphi} - 1} \quad (53)$$

$$\varphi(x) = 2\ln\left[\frac{e^{\mathcal{A}(x-x_0)} + 1}{2 e^{\frac{\mathcal{A}}{2}(x-x_0)}}\right] \quad (54)$$

Therefore, the dependences of the electric potential $\psi$ on the distance x from the wafer surface in Regions I and II of liquid film can be obtained as:

$$\psi(x) = \frac{2RT}{\mathcal{F}} \ln\left[\cos\left(\frac{\mathcal{A}}{2}(x - x_0)\right)\right] \quad (I: 0 \leq x \leq x_0) \quad (55a)$$

$$\psi(x) = \frac{2RT}{\mathcal{F}} \ln\left[\frac{e^{\mathcal{A}(x-x_0)} + 1}{2 e^{\frac{\mathcal{A}}{2}(x-x_0)}}\right] \quad (II: h \geq x \geq x_0) \quad (55b)$$

According to Eqns. (6), (8), (47) and (55a), an electric potential of the wafer surface and an electric potential distribution in Region $0 \sim x_0$ of the liquid film at a given pH can be calculated. According to Eqn. (55b), an electric potential distribution in Region $x_0 \sim h$ of the liquid film can be calculated. For protonated DIW with pHs of pH=5, 5.5 and 6, $x_0$ is 9.13 µm, 16.63 µm and 29.98 µm, respectively. The drying process may be performed at a spinning speed of 1500 rpm, at which the thickness h of the liquid film decreases radially outwards with respect to the wafer surface, from hundreds of microns at the center to tens of microns at the radius midpoint.

Figure 9:
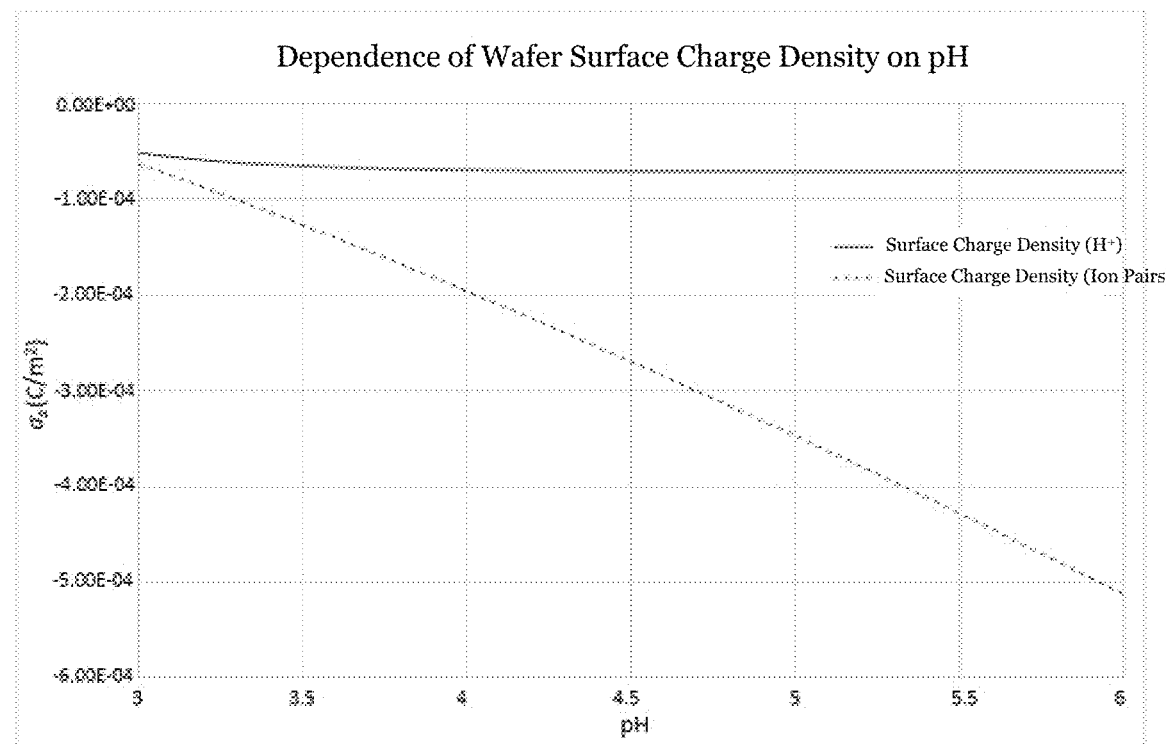
FIG. 9 shows simulated dependences of wafer surface charge density on pH in different ionic environments.

For Eqn. (55a), when x=0, $\psi(x)$ represents the electric potential of the wafer surface. Then, according to Eqns. (6), (8) and (47), the wafer surface charge density at a given pH can be calculated. FIG. 9 shows a wafer surface charge density comparison between use of protonated and non-protonated DIW. The non-protonated DIW may be ordinary DIW, to which carbon dioxide has been introduced, or which contains ion pairs. As can be seen from FIG. 9, when a wafer surface is cleaned with protonated DIW having a pH of 3-6, the resulting surface charge density is very low and remains almost the same regardless the increase of the pH. In contrast, when a wafer surface is cleaned with non-protonated DIW having a pH of 3-6, the surface charge density will be gradually increased with the increase of pH value. Therefore, compared with using non-protonated DIW, cleaning a wafer surface using protonated DIW can result in a reduced amount of electric charge on the cleaned wafer surface, which in turn enables better suppression of static electricity during drying of the wafer surface. Such better suppression is attainable even when the used protonated DIW has a pH close to 6.

Further, the process for producing the protonated cleaning solution using the protonator is easy to implement, and the resulting protonated cleaning solution is protonated DIW, from which anions have been all adsorbed onto the protonator and will not cause any secondary contamination to the wafer surface.

In order to verify the performance of protonated DIW in suppressing static electricity on a wafer surface, a test was designed and carried out under the conditions as follows:
  Wafer resistivity: 8 MΩ·cm to 12 MΩ·cm;
  Silicon dioxide film thickness: 800 Å;
  Deionized water (DIW) resistivity: 18.2 MΩ·cm;
  Resistivity of DIW having been introduced thereto with carbon dioxide ($CO_2$-DIW):≤0.2 MΩ·cm;
  Spinning speed for cleaning: 1200 rpm;
  DIW/$CO_2$-DIW flow rate: 1.5 LPM;
  Cleaning duration: 30 s;
  Spinning speed for drying: 1500 rpm;
  Drying Duration: 20 s;
  Surface potential meter: SEMILAB FAaST-350.

Figure 10:
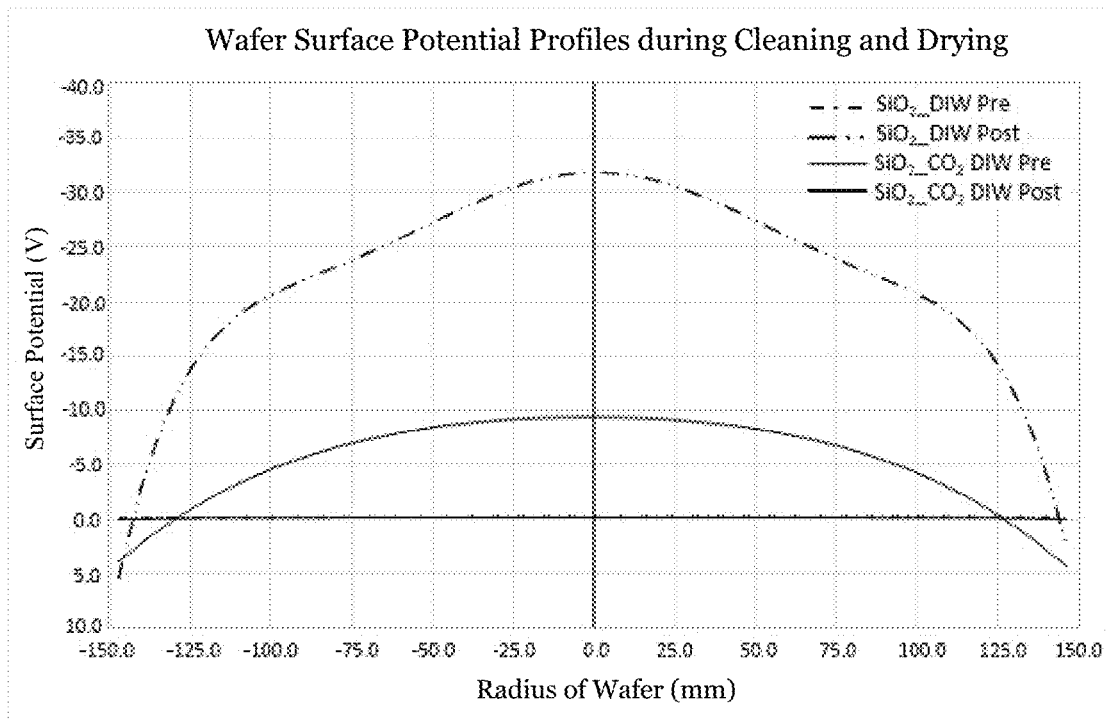
FIG. 10 shows surface potential profiles of wafers before and after they are cleaned with DIW and $CO_2$-DIW.

FIG. 10 shows surface potential profiles of wafers before and after they were cleaned with non-protonated DIW and $CO_2$-DIW. As can be seen from FIG. 10, before being cleaned ($SiO_2$_DIW Pre and $SiO_2$_$CO_2$ DIW Pre), both wafers had a surface potential of −0.15 V. During drying after cleaning with non-protonated DIW ($SiO_2$_DIW Post), the wafer surface potential gradually decreased (with its absolute value gradually increasing) from the periphery to the center, and the profile was symmetrical and lowest at −31.7 V. In contrast, during drying after cleaning with non-protonated $CO_2$-DIW ($SiO_2$_$CO_2$ DIW Post), the wafer surface potential also gradually decreased (with its absolute value gradually increasing) from the periphery to the center, and the profile was also symmetrical but lowest at −9.3 V, which was 30% of said lowest electric potential produced under the above DIW test conditions. This suggests that using an acidic cleaning solution is significantly effective in suppressing post-cleaning static electricity on a wafer surface.

As demonstrated by the test results shown in FIG. 10, the surface potential of each cleaned wafer gradually increased from the center to the periphery, and became zero at some point near the periphery and then positive further outwards beyond the point. The PZC in the $CO_2$-DIW cleaning test was radially 126.5 mm away from the center, 17.3 mm closer than the PZC in the DIW cleaning test (which was 143.8 mm away from the center). According to the dependence of wafer surface charge density on a pH of a cleaning solution shown in FIG. 2, when cleaning a wafer with DIW containing ion pairs (e.g., HCl-DIW), a positive surface potential can be obtained only when the pH of the cleaning solution is less than 2.45. $CO_2$-DIW has a resistivity of 0.2 MΩ·cm and a pH of about 5.0, much greater than 2.45, which does not allow the wafer surface to have positive charges thereon.

An explanation for the test results is proposed below. The $CO_2$-DIW cleaning solution is overall electrically neutral, i.e., containing equal concentrations of positive and negative ions. Since the cleaned wafer surface is negatively charged, the same amount of positive charge accumulate as the liquid film retreats towards the periphery during the drying process, according to Eqns. (12) to (22) deduced above, which describe charging of the wafer surface and the liquid film in a thermodynamic equilibrium, as shown in FIG. 3. The test results shown in FIG. 10 also show that, during the spin-drying process, when the liquid film recedes around the wafer's periphery, the concentration of $H^+$ ions therein is much higher than that of $HCO_3^-$ ions and corresponds to a pH less than or equal to 2.45. Thus, the liquid film can be considered as protonated DIW. Therefore, from the designed test, it can be reversely inferred that protonated DIW has a significant effect of suppressing static electricity on a wafer surface, and this inference is supported by the conclusion of Eqns. (37) to (55b) above.

Figure 11:
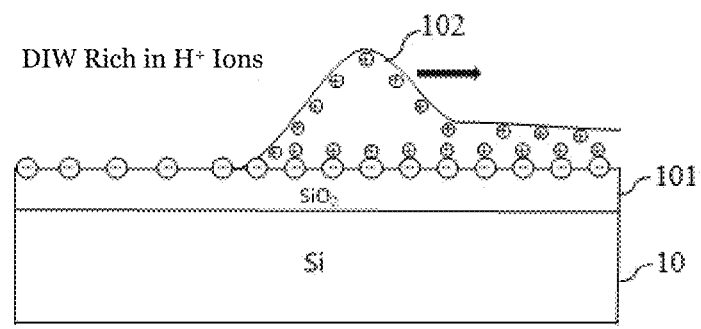
FIG. 11 schematically illustrates an electric charge distribution on a surface and in a liquid film during drying of a wafer that has been cleaned with proton-rich DIW.

Referring to FIG. 11, during drying of a wafer surface that has been cleaned with hydrogen ion-rich or protonated DIW, a central surface region of a silicon dioxide film 101 on the wafer 10 is negatively charged, and as a liquid film 102 retreats from the center of the surface of the silicon dioxide film 101 towards its periphery, positive charge gradually builds up in the liquid film 102.

Additionally, in step S3, if the drying gas is purged to the wafer surface at a very high rate, great shear forces may be produced, which will exacerbate the negative charging of the wafer surface. Accordingly, at the beginning of purging the wafer surface, a low initial flow rate of the drying gas may be used as only a weak effect of suppressing negative charging of the wafer surface can be obtained due to a low concentration of hydrogen ions in the liquid film rim. As the desiccated region expands with the progress of the purging process, the flow rate of the drying gas may be increased in response to the increasing concentration of hydrogen ions in the liquid film rim.

In summary, through cleaning a wafer surface with a protonated cleaning solution, a smaller amount of negative charge is present on the cleaned wafer surface, in comparison with cleaning it with a non-protonated cleaning solution. This can effectively suppress static electricity on the wafer surface, which may cause device failure. Thus, with this easy-to-implement technique, overall yield of integrated circuit manufacture can be improved while avoiding secondary contamination of the wafer surface.

In one embodiment of the present invention, there is provided a method for manufacturing semiconductor device, comprising:
  cleaning a surface of a wafer using the wafer cleaning method as defined above (see the description above, and no further description thereof is necessary); and
  forming a film layer structure on the cleaned wafer surface. The film layer structure may be a dielectric layer, or a material layer necessary for the formation of device structures.

The description presented above is merely that of a few preferred embodiments of the present invention and is not intended to limit the scope thereof in any sense. Any and all changes and modifications made by those of ordinary skill in the art based on the above teachings fall within the scope as defined in the appended claims.

What is claimed is:

1. A method for manufacturing semiconductor device, comprising:
  cleaning a surface of a wafer according to a wafer cleaning method, the wafer cleaning method, comprising:
    protonating a cleaning solution with a protonator comprising a cathodic electrode having a surface covered with an inert film, the protonator further comprising an anodic electrode and an anion exchange membrane, under the action of an electric field, anions in the cleaning solution passing through the anion exchange membrane and then being adsorbed to the anodic electrode and hydrogen ions in the cleaning solution moving towards the cathodic electrode and then being output in the protonated cleaning solution rich in hydrogen ions;

cleaning a wafer surface with the protonated cleaning solution which has a pH greater than 2.45 and less than 7, wherein a silicon dioxide film is formed on the wafer surface, and after the cleaning, silanol groups on a surface of the silicon dioxide film are deprotonated to make the wafer surface negatively charged, so that compared with using a non-protonated cleaning solution, cleaning the wafer surface with the protonated cleaning solution results in a reduced amount of negative charge, wherein the cleaned wafer surface is covered with a liquid film of the protonated cleaning solution and the liquid film is positively charged;

purging the wafer surface with a drying gas to remove the liquid film from a center of the wafer surface towards a periphery thereof, wherein as the liquid film retreats from the center of the wafer surface to the periphery, a concentration of hydrogen ions in the liquid film gradually increases and the same amount of positive charge of the liquid film accumulate; and forming a film layer structure on the cleaned wafer surface.

2. A wafer cleaning method, comprising:

protonating a cleaning solution with a protonator comprising a cathodic electrode having a surface covered with an inert film, the protonator further comprising an anodic electrode and an anion exchange membrane, under the action of an electric field, anions in the cleaning solution passing through the anion exchange membrane and then being adsorbed to the anodic electrode and hydrogen ions in the cleaning solution moving towards the cathodic electrode and then being output in the protonated cleaning solution rich in hydrogen ions;

cleaning a wafer surface with the protonated cleaning solution which has a pH greater than 2.45 and less than 7, wherein a silicon dioxide film is formed on the wafer surface, and after the cleaning, silanol groups on a surface of the silicon dioxide film are deprotonated to make the wafer surface negatively charged, so that compared with using a non-protonated cleaning solution, cleaning the wafer surface with the protonated cleaning solution results in a reduced amount of negative charge, wherein the cleaned wafer surface is covered with a liquid film of the protonated cleaning solution and the liquid film is positively charged; and purging the wafer surface with a drying gas to remove the liquid film from a center of the wafer surface towards a periphery thereof, wherein as the liquid film retreats from the center of the wafer surface to the periphery, a concentration of hydrogen ions in the liquid film gradually increases and the same amount of positive charge of the liquid film accumulate.

3. The wafer cleaning method of claim 2, wherein, in process of purging the wafer surface with the drying gas, electric potentials of Regions I and II of the liquid film are calculated according to:

$$\psi(x) = \frac{2RT}{\mathcal{F}} \ln\left[\cos\left(\frac{\mathcal{A}}{2}(x-x_0)\right)\right] \quad (I: 0 \le x \le x_0)$$

-continued
$$\psi(x) = \frac{2RT}{\mathcal{F}} \ln\left[\frac{e^{\mathcal{A}(x-x_0)} + 1}{2e^{\frac{\mathcal{A}}{2}(x-x_0)}}\right] \quad (II: h \ge x \ge x_0)$$

where $$\mathcal{A} = \sqrt{\frac{2C_{i0}}{\epsilon_f \epsilon_0} \frac{\mathcal{F}^2}{RT}},$$

x is a perpendicular distance of a location in the liquid film from the wafer surface, h is a thickness of the liquid film, $x_0$ is a perpendicular distance of a location with a zero electric potential in the liquid film from the wafer surface, R is the universal gas constant, T is an absolute temperature, F is the Faraday constant, $C_{i0}$ is a molar concentration of hydrogen ions, $\epsilon_f$ is relative permittivity of the protonated cleaning solution, and $\epsilon_0$ is the vacuum permittivity.

4. The wafer cleaning method of claim 2, wherein the drying gas comprises an inert gas.

5. The wafer cleaning method of claim 2, wherein protonating the cleaning solution comprises:
connecting the first electrode to a positive pole of a power supply and connecting the second electrode to a negative pole of the power supply, to create the electric field.

6. The wafer cleaning method of claim 5, further comprising, after the cleaning solution is protonated with the protonator,
introducing deionized water into the cavity, connecting the first electrode to the negative pole of the power supply and connecting the second electrode to the positive pole of the power supply, to allow the anions adsorbed to the first electrode to be desorbed and then taken away by the deionized water.

7. The wafer cleaning method of claim 2, wherein the protonator comprises a middle chamber and two cathodic chambers arranged in symmetry with respect to the middle chamber, the middle chamber configured to produce hydrogen ions, the cathodic chambers provided on their inner walls opposing the middle chamber with electrodes serving as the cathodic electrode.

8. The wafer cleaning method of claim 7, wherein the middle chamber comprises a cationic resin and cation exchange membranes, the cationic resin separated from the cathodic chambers by the cation exchange membranes.

9. The wafer cleaning method of claim 7, further comprising, after the cleaning solution is protonated with the protonator,
introducing an acidic aqueous solution to the middle chamber until a pH of an aqueous solution output therefrom reaches 7.

10. The wafer cleaning method of claim 7, wherein the cleaning solution is deionized water.

11. The wafer cleaning method of claim 2, wherein the protonator comprises a cavity defined by an insulated outer tube having opposite ends in communication with each other, wherein a first electrode serving as the anodic electrode of the protonator and the anion exchange membrane are provided on an inner side wall of the cavity so as to reside one over another from outside inwards, and wherein a second electrode serving as the cathodic electrode is provided in the cavity.

12. The wafer cleaning method of claim 11, wherein the insulated outer tube is shaped as a circular tube, wherein both the first electrode and the anion exchange membrane are arranged on the entire inner side wall, and wherein the second electrode is tubular and concentrically disposed in the cavity.

13. The wafer cleaning method of claim 11, wherein the first electrode is a porous carbon electrode.

14. The wafer cleaning method of claim 11, wherein the cleaning solution is deionized water, to which a water-soluble inorganic salt containing hydrogen ions has been added, and/or carbon dioxide has been introduced.

15. The wafer cleaning method of claim 11, wherein the insulated outer tube is shaped as a rectangular parallelepiped, wherein the first electrode and the anion exchange membrane are provided on opposite inner side walls of the cavity, and wherein the second electrode is a bias plate oriented in parallel to the anion exchange membrane.

16. The wafer cleaning method of claim 15, wherein the bias plate has a porous structure.

* * * * *